US 6,727,507 B2

(12) United States Patent
Shimazu et al.

(10) Patent No.: US 6,727,507 B2
(45) Date of Patent: Apr. 27, 2004

(54) ELECTRON BEAM PROXIMITY EXPOSURE APPARATUS AND METHOD

(75) Inventors: Nobuo Shimazu, Machida (JP); Takao Utsumi, Watchung, NJ (US)

(73) Assignee: LEEPL Corporation, Machida (JP)

( * ) Notice: Subject to any disclaimer, the term of this patent is extended or adjusted under 35 U.S.C. 154(b) by 252 days.

(21) Appl. No.: 09/765,388

(22) Filed: Jan. 22, 2001

(65) Prior Publication Data

US 2002/0096646 A1 Jul. 25, 2002

(51) Int. Cl.[7] .................. H01J 37/00; H01J 37/302
(52) U.S. Cl. .................. 250/492.1; 250/492.2; 250/492.21; 250/492.22; 250/492.3; 250/397; 250/398; 250/396 R
(58) Field of Search .................. 250/492.1, 492.2, 250/492.21, 492.22, 492.3, 396 ML, 396 R (56) References Cited

U.S. PATENT DOCUMENTS

| | | | | |
|---|---|---|---|---|
| 5,391,886 A | * | 2/1995 | Yamada et al. | 250/492.22 |
| 5,742,062 A | * | 4/1998 | Stengl et al. | 250/396 R |
| 5,770,862 A | * | 6/1998 | Ooaeh et al. | 250/398 |
| 5,831,272 A | | 11/1998 | Utsumi | |
| 5,874,739 A | * | 2/1999 | Buschbeck et al. | 250/396 R |
| 5,939,725 A | * | 8/1999 | Muraki | 250/492.22 |

OTHER PUBLICATIONS

Low Energy Electron–Beam Proximity Projection Lithography: Discovery of Missing Link, Takao Utsumi, J. Vac. Sci. Technol. B 17(6), Nov./Dec. 1999, pp. 2897–2902.

High Throughput Submicron Lithography With Electron Beam Proximity Printing, H. Bohlen et al., Solid State Technology, Sep. 1984, pp. 210–217.

* cited by examiner

*Primary Examiner*—John R. Lee
*Assistant Examiner*—David A. Vanore
(74) *Attorney, Agent, or Firm*—Nixon Peabody LLP; David S. Safran (57) ABSTRACT

The electron beam proximity exposure apparatus comprises: an electron beam source which emits an electron beam; an electron beam shaping device which shapes the electron beam; a mask which has an aperture and is disposed on a path of the shaped electron beam; a deflecting and scanning device which deflects the electron beam to scan the mask with the shaped electron beam; and a stage which holds and moves an object, wherein the mask is disposed in proximity to a surface of the object, and a pattern corresponding to the aperture of the mask is exposed on the surface of the object with the electron beam having passed through the aperture, wherein the electron beam shaping device shapes the electron beam into a slender beam of which cross section has a small width in a direction of the scanning and a large width in a direction perpendicular to the direction of the scanning. Thus, in the electron beam proximity exposure apparatus, the responsiveness of the on-off control over the application of the electron beam can be improved with keeping the scanning width large without lowering the throughput of the exposure apparatus.

5 Claims, 8 Drawing Sheets

ELECTRON BEAM PROXIMITY EXPOSURE APPARATUS AND METHOD

BACKGROUND OF THE INVENTION

1. Field of the Invention

The present invention relates to exposure apparatus and method, which are used to expose fine patterns in a manufacturing process of semiconductor integrated circuits, etc., and more particularly to electron beam proximity exposure apparatus and method, in which a mask having apertures corresponding to a pattern to be exposed is disposed in proximity to a surface of an object such as a semiconductor wafer, an electron beam is applied to the mask, and exposure with the electron beam having passed through the apertures is thereby performed.

2. Description of the Related Art

Attempts are being made to enhance integration degrees of semiconductor integrated circuits and finer circuit patterns are desired. Presently, a limit of the finer circuit patterns is defined mainly by exposure apparatuses, and a stepper, which is an optical exposure apparatus, takes various measures such as a light source that emits rays having shorter wavelengths, a larger NA (numerical aperture) and a phase shift method. However, much finer circuit patterns involve various kinds of problems such as a rapid increase of manufacturing costs. New types of exposure apparatus such as an electron beam direct lithography apparatus and an X-ray exposure apparatus have been therefore developed, but there still remain many problems in terms of stability, productivity, cost, etc.

An electron beam proximity exposure system is conventionally under research and development, since the exposure principle thereof is simple, as "High Throughput Submicron Lithography with Electron Beam Proximity Printing" (H. Bohlen et al., Solid State Technology, September 1984, pp. 210–217) (hereinafter referred to as a literature 1) exemplifies. However, it was thought that it was of no practical use since it was difficult to eliminate the proximity effect peculiar to the electron beam.

U.S. Pat. No. 5,831,272 (corresponding to Japanese Patent No. 2951947) and "Low energy electron-beam proximity projection lithography: Discovery of missing link" (Takao Utsumi, J. Vac. Sci. Technol. B 17(6), November/December 1999, pp. 2897–2902) disclose an electron beam proximity exposure apparatus that overcomes the above-mentioned problems and is usable for processing with very fine resolution at a mass production level.

Figure 1:
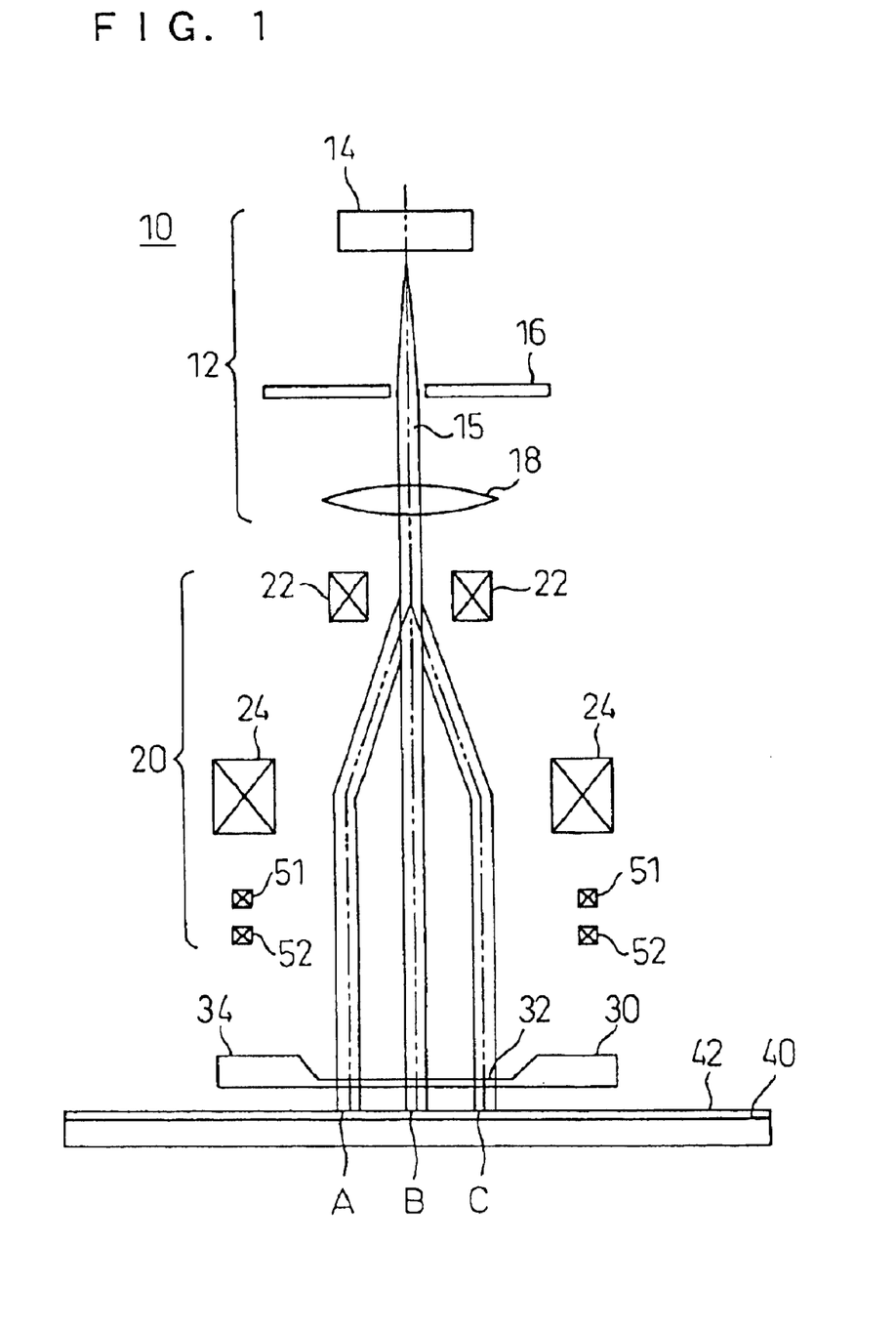
FIG. 1 is a view showing a fundamental configuration of an electron beam proximity exposure apparatus disclosed in a publicly known document.

FIG. 1 is a view showing a fundamental configuration of the electron beam proximity exposure apparatus disclosed in U.S. Pat. No. 5,831,272. Referring to this drawing, the electron beam proximity exposure apparatus disclosed in U.S. Pat. No. 5,831,272 will be briefly described. As shown in FIG. 1, in a column 10 are disposed an electron gun 12, which includes an electron beam source 14 emitting an electron beam 15, a shaping aperture 16, and a condenser lens 18 collimating the electron beam 15; scanning means 20, which includes a pair of main deflecting devices 22 and 24 and scans with the electron beam parallel to the optical axis; a mask 30, which has apertures corresponding to an exposed pattern; and an object (a semiconductor wafer) 40, of which surface is coated with a resist layer. The mask 30 has a thin film 32 with the apertures formed at the center within a thick rim 34, and the object 40 is disposed so that the surface thereof is in proximity to the mask 30. In this state, when the electron beam is vertically applied to the mask, the electron beam passing through the mask's apertures is applied to the resist layer 42 on the surface of the object 40. The entire surface of the thin film 32 on the mask 30 is scanned by deflecting the electron beam 15 (A, B, and C in FIG. 1 denote the deflected beam toward three points) with the scanning means 20, so that all aperture patterns of the mask 30 are exposed. The scanning means 20 has subsidiary deflecting devices 51 and 52, which slightly lean the electron beam, and is used to position the mask 30 and the object 40 and to correct a difference between the exposure positions due to distortion of the mask and distortion of the object.

Figure 2:
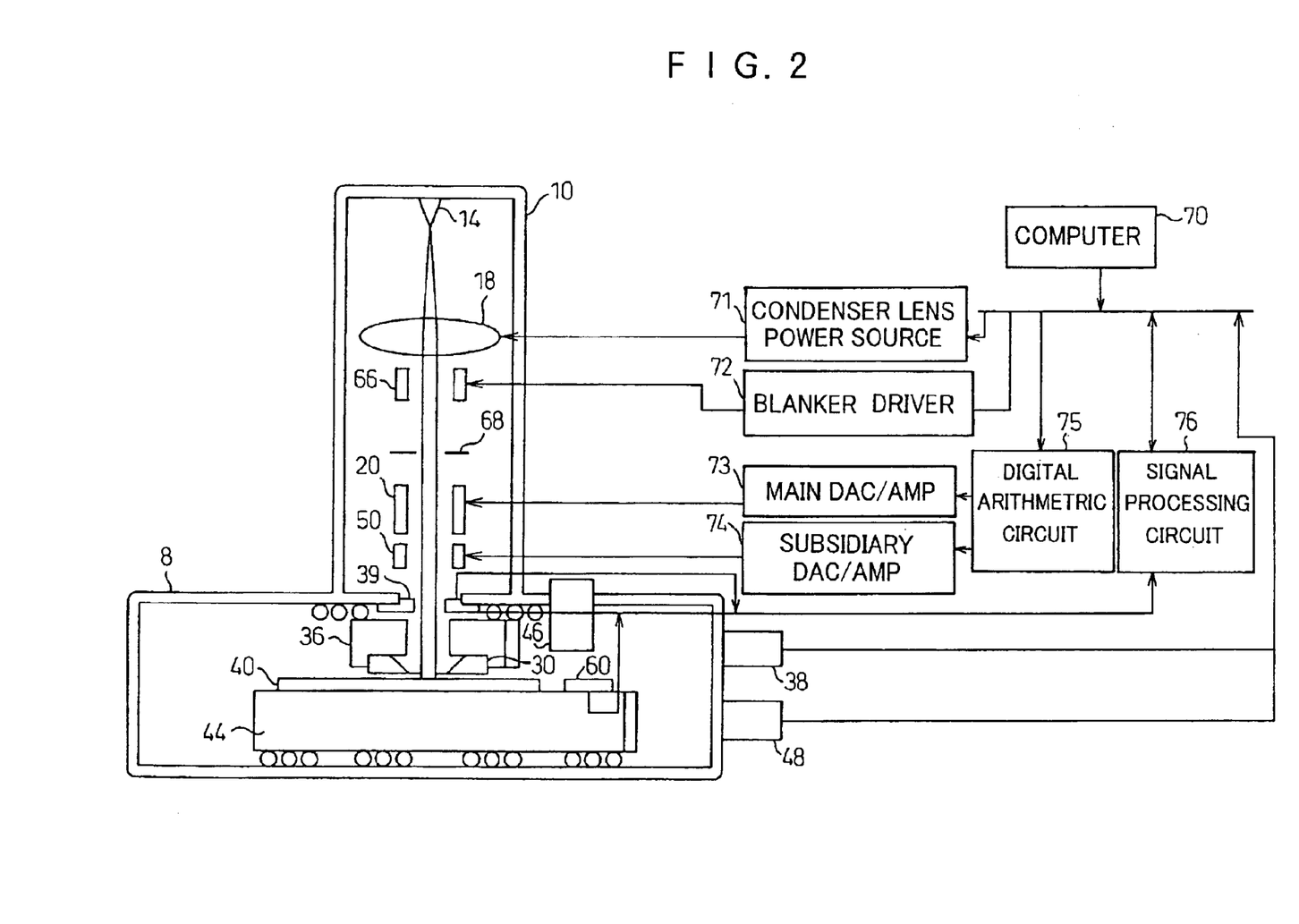
FIG. 2 is a view showing an entire configuration to practically realize the electron beam proximity exposure apparatus disclosed in the publicly known document.

FIG. 2 is a view showing an entire configuration to practically realize the electron beam proximity exposure apparatus according to the fundamental configuration of FIG. 1. The same function parts with FIG. 1 are denoted with the same reference numbers.

As shown in the drawing, in an electron optical column 10 are disposed an electron gun 14, which emits an electron beam 15, a condenser lens 18, which collimates the electron beam 15, a blanker electrode 66, which controls the application of the electron beam 15 to be on or off, a blanking aperture 68, a main deflecting device 20 and a subsidiary deflecting device 50. In a vacuum object chamber 8 are disposed a mask stage 36, which holds and moves a mask 30, a reflected electron detector 39, which detects reflected electrons, a wafer stage 44, which holds and moves a wafer 40, a standard mark 60 disposed on the wafer stage 44, and a height measurer 46, which measures a height of the surface of the wafer 40. A laser length measuring device 38 for the mask stage, which measures a travel amount of the mask stage 36, and a laser length measuring device 48 for the wafer stage, which measures a travel amount of the wafer stage 44, are disposed so that the travel amounts of the stages can be measured with remarkably high accuracy. The wafer stage 44 is movable in directions of at least two axes. Although the reflected electron detector 39 is used in this configuration, a secondary electron detector, which detects secondary electrons, can also be provided in place of the reflected electron detector. Generally, the use of the reflected electron detector so as to detect the mark position is suitable for detecting a mark made with heavy metal or the like, and the use of the secondary electron detector so as to detect the mark position is suitable in a case where difference in density is small between the mark and the surrounding material.

The electron beam proximity exposure apparatus is controlled by a computer 70. Signals detected by the laser length measuring device 38 for the mask stage and the laser length measuring device 48 for the wafer stage are supplied to a data bus of the computer 70. Signals detected by the reflected electron detector 39, a detector disposed on the standard mark and the height measurer 46 are supplied to a signal processing circuit 76, converted into digital signals and then supplied to the data bus of the computer 70. The condenser lens 18 is an electromagnetic lens or an electrostatic lens, which is controlled by the computer 70 through a condenser lens power source 71. Similarly, the blanker electrode 66 is controlled through a blanker driver 72. The computer 70 supplies deflection amount data to a digital arithmetic circuit 75, which performs an operation to correct the deflection amount data according to previously stored correction data and supplies corrected data to a main DAC/AMP 73 and a subsidiary DAC/AMP 74. The main DAC/AMP 73 and the subsidiary DAC/AMP 74 convert the corrected deflection amount data into analog signals, amplify the analog signals and supply the resulting signals to the main deflecting device 20 and the subsidiary deflecting device 50, respectively. The electron beam is deflected as desired accordingly.

The electron gun 14 is always in an operating state so as to stably output the electron beam, and always outputs the electron beam. Hence, it is necessary to provide a blanker to control as need arises whether or not the electron beam is applied to the mask 30 and to the wafer 40 through the mask 30. The blanker comprises the blanker electrode 66, the blanking aperture 68 and the blanker driver 72, and controls the application of the electron beam to be on or off. When the blanker driver 72 applies no voltage to the blanker electrode 66, the electron beam 15 just goes straight on, passes through the blanking aperture 68, and is applied to the mask 30. When the blanker driver 72 applies a voltage to the blanker electrode 66, the blanker electrode 66 forms an electric field, so that the electron beam 15 deflects, is interrupted by the blanking aperture 68, and is not applied to the mask 30. The on-off control by the blanker over the application of the electron beam is required to be performed at high speed.

Figure 3:
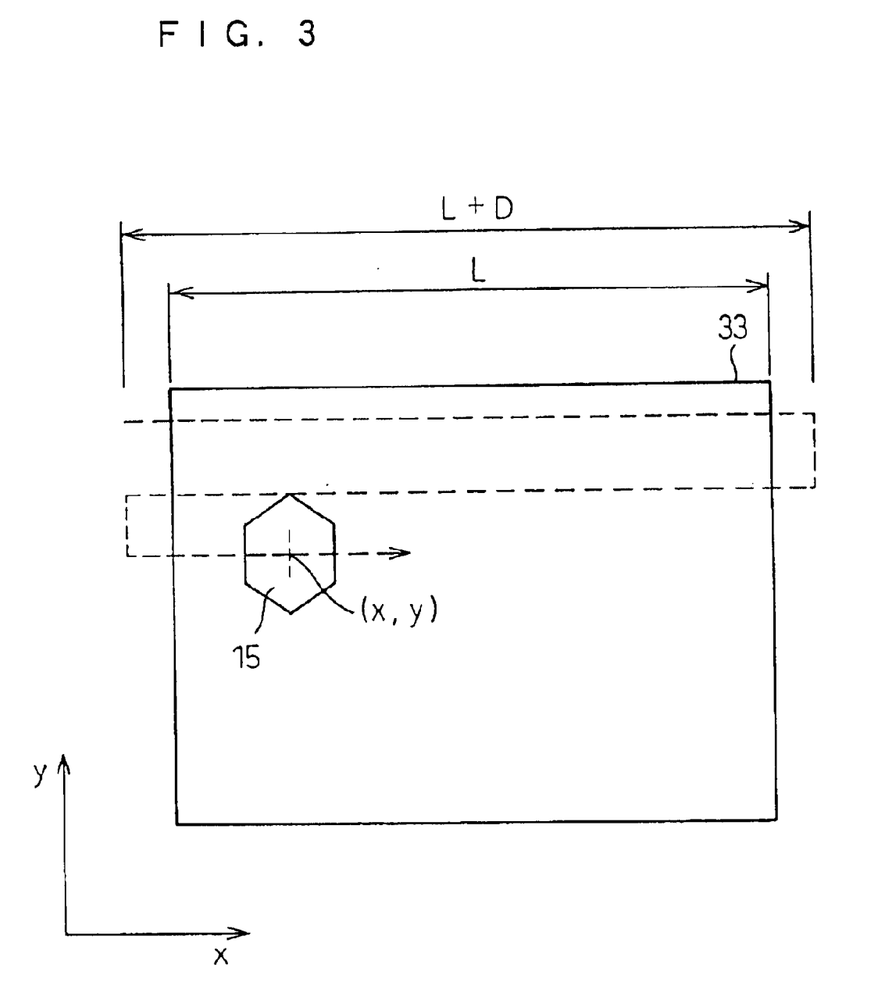
FIG. 3 is a diagram showing an example of a scan with the electron beam disclosed in the publicly known document.

The above-described literature 1 discloses a method in which the electron beam 15 is hexagonally shaped and the exposures of the adjacent scans are made overlap with each other while a scanning area 33 of the mask is scanned as shown in FIG. 3. The bigger the beam is, the bigger the area can be exposed by one scanning, and a big beam is hence preferable in point of the throughput of the exposure apparatus. In the case where the distribution of the intensity in the hexagonal electron beam is uniform, the scanning method shown in FIG. 3 can obtain an uniform exposure amount distribution overall with reducing influence of divergence in the scanning positions. Since the unevenness of the exposure amount causes errors in the pattern widths of the developed resist, the unevenness is required to be as small as possible, for example, to be less than a few percent to a dozen percent. It is extremely difficult, however, to control the unevenness of the intensity distribution within such extent in the hexagonal electron beam 15 as shown in FIG. 3 overall, and unpermissible unevenness of the intensity distribution is liable to occur.

The present applicant has proposed, in Japanese Patent Application No. 2000-222201, a method where the interval between the adjacent scanning lines is satisfactorily shorter than the electron beam width in the direction perpendicular to the scanning direction, and the scanning position is gradually moved while each portion of the exposure pattern is exposed by scanning of a plurality of times. Thereby, even if the intensity distribution of the electron beam is uneven, the intensity distribution is leveled off, and the unevenness of the exposure is thus reduced. Also in this case, the big beam is preferable in point of the throughput of the exposure apparatus.

However, the scanning width of the beam is required to be broad when the electron beam is big. As shown in FIG. 3, where L is the width of the scanning area 33 and D is the width of the beam, the scanning width is required to be not smaller than L+D in order to perform the uniform exposure over the scanning area. Hence, if the beam is made big, the scanning width is required to be bigger for that, which results in problems of increasing costs of the deflecting devices and lengthening the scanning period of time.

Figure 4:
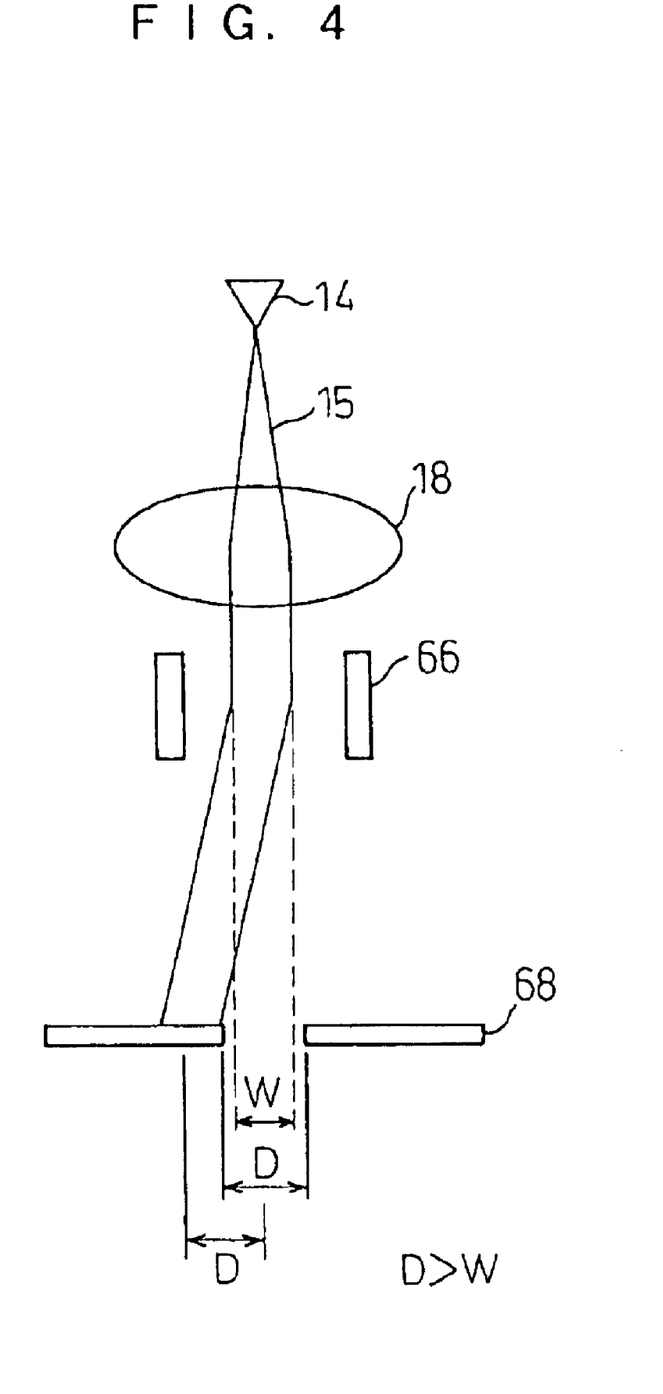
FIG. 4 is a diagram showing operation of a blanker in the electron beam proximity exposure apparatus.

Moreover, the big electron beam lowers the speed of the on-off control by the blanker over the application of the electron beam. FIG. 4 is a diagram for explaining this problem. As shown in the drawing, the electron beam 15 outputted from the electron gun 14 is collimated by the condenser lens 18 and goes through an opening of the blanker electrode 66. The blanking aperture 68 has an opening that is slightly bigger than the collimated electron beam having gone through the condenser lens 18. When no voltage is applied to the blanker electrode 66, the collimated electron beam just goes straight on and passes through the opening of the blanking aperture 68 as represented with broken lines. On the other hand, when voltage is applied to the blanker electrode 66, the collimated electron beam is deflected, as represented with solid lines, by the electric field formed around the blanker electrode 66, and is applied on a part of the blanking aperture 68 except for the opening, so that the electron beam is interrupted. The blanker thus controls the on and off of the application of the electron beam.

Here D>W, where W is the width of the collimated electron beam and D is the width of the opening of the blanking aperture 68. In order to completely interrupt the collimated electron beam, it is required to deflect the collimated electron beam by D on the blanking aperture 68. Hence, in order to interrupt the collimated electron beam, the bigger the width W of the collimated electron beam is, the more the deflection of the electron beam is required. It is necessary to apply a high voltage to the blanker electrode 66 so as to greatly deflect the electron beam. Since the slew rate of the circuits composing the blanker driver 72 is constant, the higher the voltage outputted from the blanker driver 72 is, the longer the response time thereof is. In short, the bigger the width W of the collimated electron beam is, the longer the response time of the on-off control over the application of the electron beam is. A part of the electron beam is applied to the mask during the change between on and off of the application of the electron beam. Then, if the response time of the on-off control over the application of the electron beam is lengthened, uncontrolled exposure can be performed, which causes a problem of deterioration in the quality of the exposed pattern. It is hence preferable that the size of the electron beam is as small as possible in point of the on-off control by the blanker over the application of the electron beam.

As described above, the size of the electron beam is the subject of the trade-off between the throughput of the exposure apparatus and the responsiveness of the on-off control over the application of the electron beam. The both aspects are considered to determine a suitable size of the electron beam according to the use of the apparatus.

SUMMARY OF THE INVENTION

The present invention has been developed in view of the above-described circumstances, and has as its object the improvement of the responsiveness of the on-off control over the application of the electron beam without lowering the throughput of the exposure apparatus.

In order to achieve the above-described object, an electron beam proximity exposure apparatus according to the present invention comprises: an electron beam source which emits an electron beam; an electron beam shaping device which shapes the electron beam; a mask which has an aperture and is disposed on a path of the shaped electron beam; a deflecting and scanning device which deflects the electron beam to scan the mask with the shaped electron beam; and a stage which holds and moves an object, wherein the mask is disposed in proximity to a surface of the object, and a pattern corresponding to the aperture of the mask is exposed on the surface of the object with the electron beam having passed through the aperture, wherein the electron beam shaping device shapes the electron beam into a slender beam of which cross section has a small width in a direction of the scanning and a large width in a direction perpendicular to the direction of the scanning.

According to the present invention, since the cross section of the electron beam with which the mask is scanned has the large width in the direction perpendicular to the scanning direction, the throughput of the exposure apparatus is high. On the other hand, since the electron beam has the small width in the scanning direction, the scanning width can be small. Moreover, if the deflecting direction by the blanker is set to be the scanning direction, the width of the electron beam is small and the responsiveness of the on-off control over the application of the electron beam can be high.

Preferably, in order to shape the electron beam into the electron beam of which cross section is slender, an electrostatic cylindrical lens which has power in a single direction is used.

Preferably, in order to reduce unevenness of the exposure, an interval between adjacent scanning lines is made satisfactorily shorter than the width of the electron beam in the direction perpendicular to the scanning direction, and the scanning position is gradually moved while each portion of the exposure pattern is exposed by the scanning of a plurality of times. In this case, it is preferable that each portion of the pattern on the object is exposed by the scanning with the electron beam of at least five times.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein.

DETAILED DESCRIPTION OF THE PREFERRED EMBODIMENTS

Figure 5:
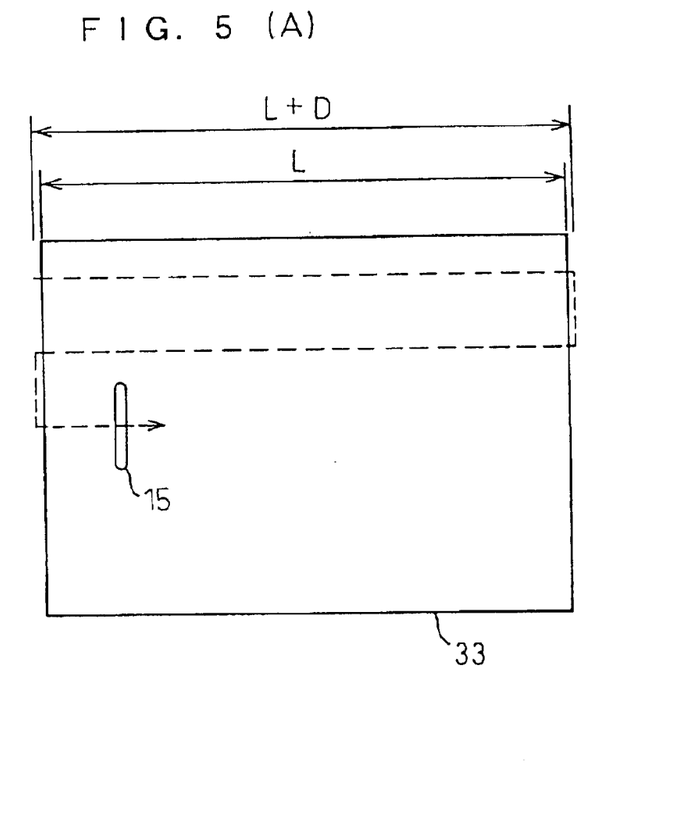
FIGS. 5(A) and 5(B) are diagrams showing the principle of the present invention.

FIGS. 5(A) and 5(B) are diagrams showing the principle of the present invention.

As shown in FIG. 5(A), in an electron beam proximity exposure apparatus according to the present invention, a collimated electron beam 15 with which a mask is scanned is shaped into a slender beam of which cross section has a small width in a scanning direction and a large width in a direction perpendicular to the scanning direction. Thereby, since the cross section of the collimated electron beam 15 with which the mask is scanned has the large width in the direction perpendicular to the scanning direction, the throughput of the apparatus is high. On the other hand, the width in the scanning direction is small, so that a scanning width can be small. Moreover, by setting a deflecting direction by a blanker to be the scanning direction as shown in FIG. 5(B), since the width of the electron beam is small, responsiveness of on-off control over application of the electron beam can be high.

Hereinafter an embodiment of the present invention will be described. The embodiment of the present invention differs in only portions of a condenser lens and blanker electrodes from the conventional example in the electron beam proximity exposure apparatus described in FIGS. 1 and 2, and only those portions will be then described.

Figure 6:
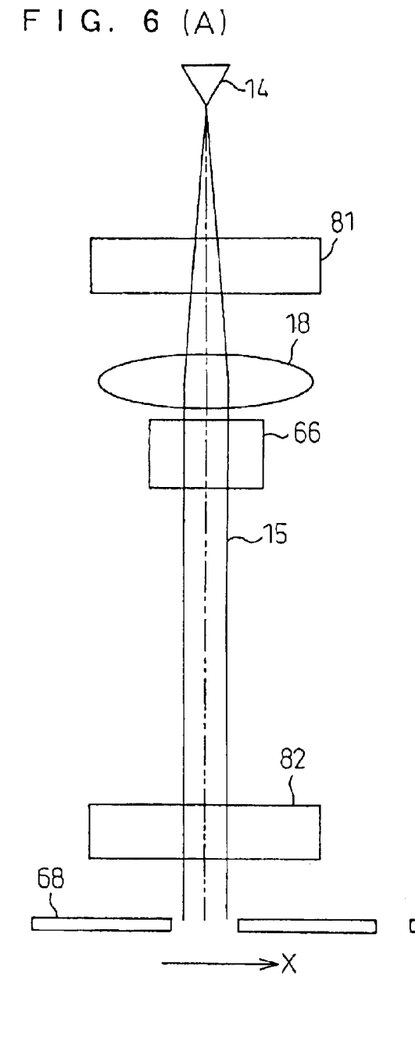
FIGS. 6(A) and 6(B) are views showing a configuration around a condenser lens in the electron beam proximity exposure apparatus according to the first embodiment of the present invention.

FIGS. 6(A) and 6(B) are views showing portions of an electron gun 14, the condenser lens 18 and the blanker electrodes 66 in the electron beam proximity exposure apparatus according to the embodiment. FIG. 6(A) is a sectional view including the optical axis (the Z-axis) and the X-axis, and FIG. 6(B) is a sectional view including the Z-axis and the Y-axis. Here the blanker electrodes 66 comprise two electrodes parallelly disposed. When voltage is applied, the blanker electrodes 66 form an electrode in the Y-axis direction and no electric field in the direction of the X-axis.

As shown in the drawings, electrostatic cylindrical lenses 81 and 82 are further provided in the present embodiment. The electrostatic cylindrical lenses 81 and 82 are electrostatic lenses that have converging power in one direction and have no converging power in a direction perpendicular to that. Here the electrostatic cylindrical lenses 81 and 82 have no converging power in the X-axis direction as shown in FIGS. 6(A) and have converging power in the Y-axis direction as shown in FIG. 6(B).

In the X-Z plane, as shown in FIG. 6(A), the electron beam outputted from the electron gun 14 just goes through the electrostatic cylindrical lens 81 without being affected, and is made into the collimated beam with a large width by the condenser lens 18, which has its focal point at the electron gun 14. This width (the width in the X-axis direction) of the electron beam corresponds to the width in the major axis direction of the slender beam. Further, the electron beam just goes through the blanker electrodes 66 and the electrostatic cylindrical lens 82 without being affected, and goes through an opening of the blanking aperture 68.

In the Y-Z plane, as shown in FIG. 6(B), the electron beam outputted from the electron gun 14 is converged by the electrostatic cylindrical lens 81 and is further converged by the condenser lens 18; thereby, it does not become a collimated beam but a convergent beam. This convergent beam goes through the blanker electrodes 66, converges once at the secondary focal point R, and then diverges again. While diverging, the electron beam enters the electrostatic cylindrical lens 82, which has its focal point at the secondary focal point R, and is made into the collimated beam with a small width. This width (the width in the Y-axis direction) of the electron beam corresponds to the width in the minor axis direction of the slender beam. Thus, after passing the electrostatic cylindrical lens 82, the beam is collimated in both directions of the X direction and the Y direction.

The electron beam is not affected by the blanker in the X-Z plane. In the Y-Z plane, when no voltage is applied to the blanker electrodes 66, the electron beam is not deflected and just goes through the opening of the blanking aperture 68; and when the voltage is applied to the blanker electrodes 66, the electron beam is deflected toward a path denoted with a reference numeral 83 by the electric field formed between the blanker electrodes 66 and is interrupted by the blanking aperture 68. The application of the electron beam 15 is thus controlled to be on or off by the blanker. Since the opening of the blanking aperture 68 is narrow in the Y direction, the deflection amount of the electron beam to control the application of the electron beam to be on or off can be small, so that the application of the electron beam can be controlled to be on or off at high speed.

Next, the configurations of the condenser lens 18 and the electrostatic cylindrical lenses 81 and 82 will be described. In the present embodiment, these lens are embodied with electrostatic lenses.

Figure 7A:
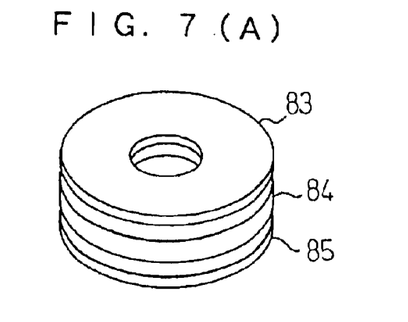
FIGS. 7(A), 7(B) and 7(C) are views showing examples of configurations of an electrostatic lens and electrostatic cylindrical lenses used in the electron beam proximity exposure apparatus according to the first embodiment of the present invention.
Figure 7B:
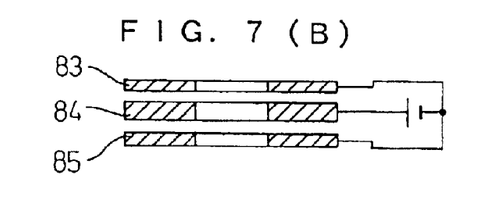

FIG. 7(A) shows an example of electrodes embodying the condenser lens 18, and this configuration is conventionally well-known. As shown in the drawing, three pieces of circular electrodes 83, 84 and 85 having circular openings at the centers thereof are disposed separately from each other so that the centers are disposed on the optical axis. Then, as shown in FIG. 7(B), the circular electrodes 83 and 85 at both sides are grounded, and the circular electrode 84 at the middle is applied with a positive voltage. The electrostatic lens having a positive power symmetrical with respect to the optical axis is thereby formed.

Figure 7C:
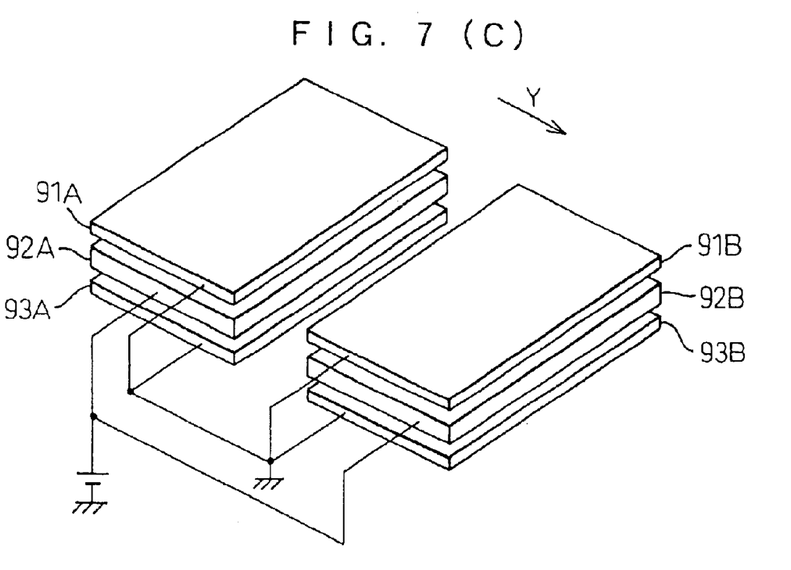

FIG. 7(C) shows an example of electrodes embodying the electrostatic cylindrical lenses 81 and 82. As shown in the drawing, three pieces of sheet electrodes 91A, 92A and 93A and three pieces of sheet electrodes 91B, 92B and 93B are parallelly disposed separately from each other so that side surfaces of the electrodes 91A and 91B, 92A and 92B, and 93A and 93B respectively face to each other. In other words, it makes the configuration that three pieces of sheet electrode are parallelly disposed separately from each other, and the central portions thereof are cut away in a certain distance. The electrodes 91A and 91B, and 93A and 93B, are grounded, and the electrodes 92A and 92B are applied with a positive voltage, so that the electrostatic cylindrical lens having a positive power in only the direction denoted with Y in the drawing is formed.

Figure 8:
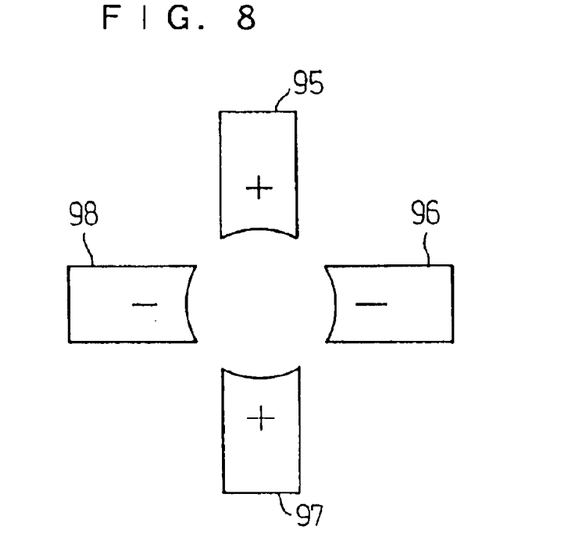
FIG. 8 is a view showing another example of a configuration of an electrostatic cylindrical lens used in the electron beam proximity exposure apparatus according to the first embodiment of the present invention.

The electrostatic cylindrical lens is also embodied with a quadrupole lens in which opposite electrodes 95 and 97 are applied with a positive voltage and opposite electrodes 96 and 98 are applied with a negative voltage as shown in FIG. 8.

Figure 9:
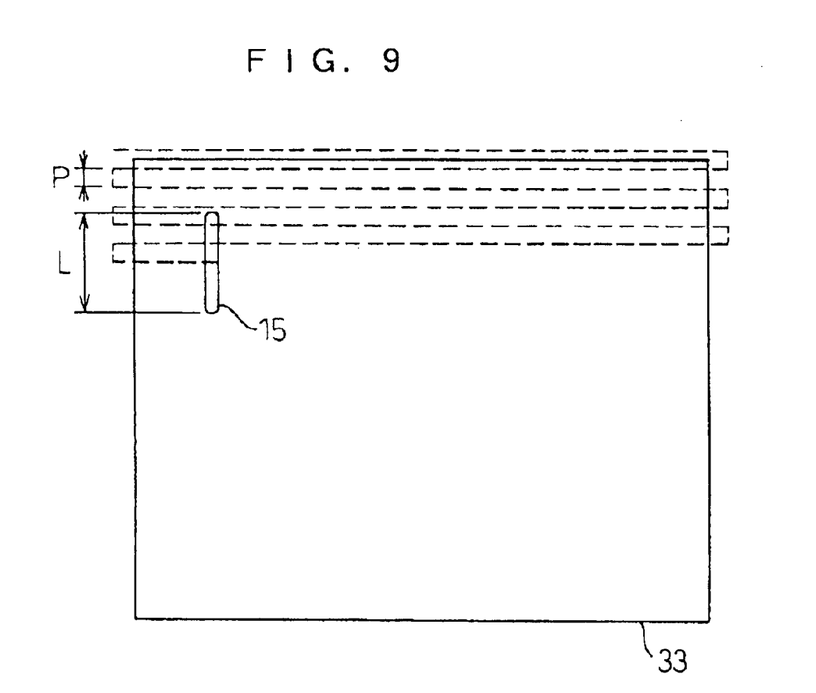
FIG. 9 is a diagram showing a scan on a mask with the electron beam in the electron beam proximity exposure apparatus according to the first embodiment of the present invention.

The mask is scanned with the slender electron beam formed as described above. In this case, as shown in FIG. 9, where L is a width of the slender electron beam in the direction perpendicular to the scanning direction and P is an interval between adjacent scanning lines, L is several times, preferably at least five times, as long as P so that every point on the mask is exposed by scanning of a plurality of times. Thus, the influence of the unevenness in the direction perpendicular to the scanning direction of the intensity of the slender electron beam is reduced.

As described in the above, according to the present invention, in the electron beam proximity exposure apparatus scanning the mask, the responsiveness of the on-off control over the application of the electron beam can be improved with keeping the scanning width large without lowering the throughput of the exposure apparatus.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. An electron beam proximity exposure apparatus, comprising:

an electron beam source which emits an electron beam;

an electron beam shaping device which shapes the electron beam;

a mask which has an aperture and is disposed on a path of the shaped electron beam;

a deflecting and scanning device which deflects the electron beam to scan the mask with the shaped electron beam;

a blanker electrode and a blanking aperture which take on-off control of emission of the electron beam; and a stage which holds and moves an object, wherein the mask is disposed in proximity to a surface of the object, and patterns corresponding to the aperture of the mask exposed on the surface of the object with the electron beam having passed through the aperture, wherein the electron beam shaping device comprises an electrostatic cylindrical lens which has power in a single direction which shapes the electron beam into a slender beam of which cross section has a small width in a direction of the scanning and a large width in a direction perpendicular to the direction of the scanning.

2. The electron beam proximity exposure apparatus as defined in claim 1, wherein:

an interval between adjacent scanning lines in the scanning with the shaped electron beam by the deflecting and scanning device is shorter than the width of the shaped electron beam in the direction perpendicular to the direction of the scanning;

and each portion of the pattern on the object is exposed by the scanning with the electron beam of a plurality of times.

3. The electron beam proximity exposure apparatus as defined in claim 2, wherein the pattern on the object is exposed by the scanning with the electron beam of at least five times.

4. An electron beam proximity exposure method, wherein a mask having an aperture corresponding to a pattern to be exposed is disposed in proximity to a surface of an object, an electron beam is applied to scan the mask, a blanker electrode and a blanking aperture which take on-off control of emission of the electron beam, and a pattern corresponding to the aperture is exposed on the surface of the object with the electron beam having passed through the aperture, wherein the electron beam is a slender beam the cross section of which has a small width in a direction of the scanning and a large width in a direction perpendicular to the direction of the scanning.

5. The electron beam proximity exposure method as defined in claim 4, wherein:

an interval between adjacent scanning lines in the scanning with the electron beam is shorter than the width of the electron beam in the direction perpendicular to the direction of the scanning; and each portion of the pattern on the object is exposed by the scanning with the electron beam of a plurality of times.

* * * * *